(12) United States Patent
Cheng et al.

(10) Patent No.: US 9,799,771 B2
(45) Date of Patent: Oct. 24, 2017

(54) FINFET AND METHOD FOR MANUFACTURING THE SAME

(71) Applicant: TAIWAN SEMICONDUCTOR MANUFACTURING CO., LTD., Hsinchu (TW)

(72) Inventors: Tung-Wen Cheng, New Taipei (TW); Che-Cheng Chang, New Taipei (TW); Mu-Tsang Lin, Hemei Township (TW); Zhe-Hao Zhang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/690,720

(22) Filed: Apr. 20, 2015

(65) Prior Publication Data

US 2016/0308058 A1    Oct. 20, 2016

(51) Int. Cl.
| | |
|---|---|
| *H01L 29/78* | (2006.01) |
| *H01L 21/3065* | (2006.01) |
| *H01L 29/66* | (2006.01) |
| *H01L 21/762* | (2006.01) |
| *H01L 29/06* | (2006.01) |
| H01L 21/8234 | (2006.01) |
| H01L 27/088 | (2006.01) |

(52) U.S. Cl.
CPC ...... *H01L 29/7853* (2013.01); *H01L 21/3065* (2013.01); *H01L 21/762* (2013.01); *H01L 29/0653* (2013.01); *H01L 29/66795* (2013.01); *H01L 29/7851* (2013.01); H01L 21/823431 (2013.01); H01L 27/0886 (2013.01)

(58) Field of Classification Search
CPC ......... H01L 21/823431; H01L 27/0886; H01L 29/7853
USPC .................................. 257/374; 438/284, 701
See application file for complete search history.

(56) References Cited

U.S. PATENT DOCUMENTS

| | | | |
|---|---|---|---|
| 6,787,854 B1 * | 9/2004 | Yang | H01L 29/66818 257/347 |
| 7,196,021 B2 | 3/2007 | Tan et al. | |
| 9,023,705 B1 * | 5/2015 | Paul | H01L 21/823431 438/283 |
| 2008/0230832 A1 * | 9/2008 | Cho | H01L 29/66795 257/327 |
| 2013/0270641 A1 * | 10/2013 | Chi | H01L 21/823821 257/351 |
| 2013/0292805 A1 * | 11/2013 | Cai | H01L 29/66795 257/622 |
| 2013/0309838 A1 * | 11/2013 | Wei | H01L 21/76229 438/424 |

(Continued)

FOREIGN PATENT DOCUMENTS

TW            201417189 A      5/2014

*Primary Examiner* — George Fourson, III
(74) *Attorney, Agent, or Firm* — Maschoff Brennan

(57) ABSTRACT

Methods for manufacturing a FinFET and a FinFET are provided. In various embodiments, the method for manufacturing a FinFET includes etching a base substrate to form a trapezoidal fin structure. Next, an isolation layer is deposited covering the etched base substrate. Then, the trapezoidal fin structure is exposed. The trapezoidal fin structure includes a top surface and a bottom surface, and the top surface has a width larger than that of the bottom surface.

20 Claims, 6 Drawing Sheets

600

(56) References Cited

U.S. PATENT DOCUMENTS

| | | | |
|---|---|---|---|
| 2013/0330889 A1* | 12/2013 | Yin | H01L 21/823821 438/197 |
| 2014/0027860 A1 | 1/2014 | Glass et al. | |
| 2014/0048870 A1* | 2/2014 | Ryu | H01L 29/7827 257/330 |
| 2014/0159126 A1* | 6/2014 | Wei | H01L 29/66795 257/288 |
| 2014/0264717 A1* | 9/2014 | Shieh | H01L 29/06 257/499 |
| 2015/0024573 A1* | 1/2015 | Jacob | H01L 21/76224 438/424 |
| 2015/0102392 A1* | 4/2015 | Yu | H01L 21/823431 257/288 |
| 2015/0123166 A1* | 5/2015 | Jacob | H01L 29/785 257/192 |
| 2015/0137271 A1* | 5/2015 | Cai | H01L 29/66545 257/411 |
| 2015/0171216 A1* | 6/2015 | Xie | H01L 21/0217 257/401 |
| 2015/0200128 A1* | 7/2015 | Jacob | H01L 21/76224 438/424 |
| 2015/0206890 A1* | 7/2015 | Liaw | H01L 27/1104 257/391 |
| 2015/0214369 A1* | 7/2015 | Fronheiser | H01L 29/0847 257/192 |
| 2015/0235905 A1* | 8/2015 | Liaw | H01L 21/823481 438/283 |
| 2015/0279972 A1* | 10/2015 | Xie | H01L 29/66795 438/283 |
| 2015/0279973 A1* | 10/2015 | Akarvardar | H01L 29/66795 438/283 |
| 2016/0005834 A1* | 1/2016 | Pawlak | H01L 29/6681 257/347 |
| 2016/0099244 A1* | 4/2016 | Ho | H01L 29/7848 257/401 |

* cited by examiner

FINFET AND METHOD FOR MANUFACTURING THE SAME

BACKGROUND

The semiconductor industry has experienced exponential growth. Over the course of the growth, functional density of the semiconductor devices has increased with the decrease of device feature size or geometry. The scaling down process generally provides benefits by increasing production efficiency, reducing costs, and/or improving device performance, but increases complexity of the integrated circuit (IC) manufacturing processes.

To address the increase of manufacturing complexity, various non-planar transistors, such as a fin-like field-effect transistor (FinFET), have been developed to replace a planar transistor. However, device performance of such FinFET is still not satisfactory in advanced applications of technology. Therefore, improvements in structures and methods of forming a FinFET with better device performance continue to be sought.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
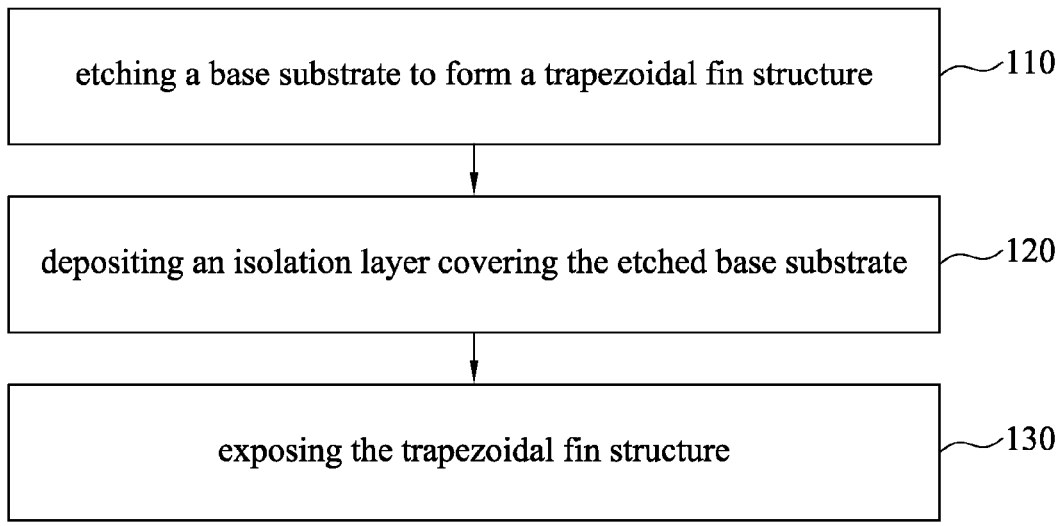
FIG. 1 is a flow chart illustrating a method for manufacturing a FinFET in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "top," "bottom," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As aforementioned, device performance of a conventional fin-like field-effect transistor (FinFET) is still not satisfactory in advanced applications of technology. The FinFET formed by a conventional method is prone to form a fin structure with a top surface area smaller than a bottom surface area, which the width of the top surface of the fin structure is smaller than the width of the bottom surface of the fin structure. Therefore, only a small portion of the fin structure is capable of serving as a channel of the FinFET, and the device performance cannot be improved.

In order to solve the above-mentioned problems, the present disclosure provides a FinFET and methods for manufacturing the same, which the FinFET includes a fin structure having a top surface area larger than that of a bottom surface. Therefore, the FinFET has an enlarged effective channel region, which improves the FinFET device performance.

Referring to FIG. 1, which is a flow chart illustrating a method 100 for manufacturing a FinFET in accordance with some embodiments. It is understood that additional steps may be implemented before, during, and after the method, and some of the steps described may be replaced or eliminated for other embodiments of the method. It is noteworthy that sequences of the steps of the method 100 described herein are merely examples, and are not intended to be limiting. Various changes, substitutions, and alterations may be made without departing from the spirit and scope of the present disclosure.

In step 110, a base substrate is etched to form a trapezoidal fin structure. The formed trapezoidal fin structure includes a top surface and a bottom surface, and the top surface has a width larger than the width of the bottom surface. The trapezoidal fin structure includes a larger top surface area to enhance the effective channel area of the FinFET. The effective channel area of the FinFET is the portion of gate material interface with the fin structure, and is related to the device performance of the FinFET. When the effective channel area is enlarged, the device performance is improved.

The material of the trapezoidal fin structure may be the same as the base substrate. Examples of the material of the base substrate and the trapezoidal fin structure include but are not limited to silicon, silicon germanium, silicon carbide, gallium arsenic, gallium phosphide, indium phosphide, indium arsenide, indium antimonide and a combination thereof.

In some embodiments, the trapezoidal fin structure has only one inclined sidewall, and the other sidewall of the trapezoidal fin structure is vertical. In some embodiments, both sidewalls of the trapezoidal fin structure are inclined, and the sidewalls may be one inwardly inclined sidewall and one outwardly inclined sidewall, or two inwardly inclined sidewalls, which the directions of the inward and the outward are relative to the center of the fin structure. For instance, when the sidewalls are both inwardly inclined sidewalls, i.e. inclined toward the center of the fin structure, the trapezoidal fin structure is an inverted trapezoidal fin structure.

In some embodiments, etching the base substrate is performed by plasma etching. The plasma etching may be performed by $CH_4$, $CH_xF_y$, $Cl_2$, HBr plasma, or the like, which $CH_xF_y$ represents a fluoroalkane plasma, and x and y denote positive integers. The etching chemistry, such as flow rates, power ranges, bias voltages, etch duration and other parameters associated with the etching, may affect the shape of the formed trapezoidal fin structure. Therefore, the etching parameters in step 110 of the method 100 for manufacturing the FinFET are tuned to form the trapezoidal fin structure with a larger top surface area to enhance effective channel area of the FinFET.

In some embodiments, etching the base substrate is performed at an etching bias in a range from about 100 millivolts (mV) to about 200 mV. In general, the etching bias of a conventional method for manufacturing a FinFET is in a range from about 0 mV to about 100 mV. The formed fin structure is prone to have a large bottom surface due to less amount of ions bump against the bottom of the fin structure. The method 100 increases the etching bias to increase the amount of ions that bump against the bottom of the fin structure, and the fin structure with a smaller bottom surface is then formed.

In some embodiments, etching the base substrate is performed at a power in a range from about 400 Watts (W) to about 800 W. In general, the power of a conventional method for manufacturing a FinFET is in a range from about 50 mV to about 200 mV. The formed fin structure is prone to have a large bottom surface due to the reasons similar to the etching bias. The method 100 increases the power to form the fin structure with a smaller bottom surface.

In some embodiments, etching the base substrate is performed at a flow rate of the plasma in a range from about 50 standard cubic centimeter per minute (sccm) to about 250 sccm. In general, the flow rate of a conventional method for manufacturing a FinFET is in a range from about 0 sccm to about 50 sccm. The formed fin structure is prone to have a large bottom surface due to plasma gas deposition at the bottom of the fin structure. The method 100 increases the flow rate to reduce the plasma gas deposition at the bottom of the fin structure, and the fin structure with a smaller bottom surface is then formed.

In step 120, an isolation layer is deposited covering the etched base substrate. Then, the trapezoidal fin structure is exposed in step 130. In some embodiments, the isolation layer is formed over the etched base substrate, and the upper portion of the isolation layer is removed to expose the trapezoidal fin structure. The isolation layer may be formed by any suitable depositing methods, such as chemical vapor deposition (CVD), atmospheric pressure CVD (APCVD), low pressure CVD (LPCVD), plasma enhanced CVD (PECVD), metal-organic CVD (MOCVD), physical vapor deposition (PVD), atomic layer deposition (ALD), chemical solution deposition, sputtering or a combination thereof. The upper portion of the isolation layer may be removed by chemical-mechanical polishing (CMP) and/or etching such as reactive ion (RI) etching.

In some embodiments, the isolation layer is a shallow trench isolation (STI) structure. The isolation layer may be made of a dielectric material. Examples of the dielectric material include but are not limited to silicon oxide, silicon nitride, silicon oxynitride, fluoride-doped silicate glass, a low-k dielectric material and a combination thereof.

In some embodiments, the method 100 further includes a step of forming a gate stack across over the fin structure after step 130. The gate stack may include a gate dielectric layer and a gate electrode, and may be formed by any suitable methods, such as deposition. In some embodiments, the gate dielectric layer and the gate electrode are formed by chemical vapor deposition (CVD), atmospheric pressure CVD (APCVD), low pressure CVD (LPCVD), plasma enhanced CVD (PECVD), metal-organic CVD (MOCVD), physical vapor deposition (PVD), atomic layer deposition (ALD), chemical solution deposition, sputtering or a combination thereof. The material of the gate electrode may be any suitable semiconductor material, such as polysillicon, germanium, combinations of silicon and germanium, metal, metal alloy, or metal silicide. Examples of the material of the metal gate electrode include but are not limited to tungsten (W), titanium (Ti), tantalum (Ta), aluminum (Al), nickel (Ni), ruthenium (Ru), palladium (Pd), platinum (Pt), tungsten nitride ($WN_x$), titanium nitride (TiN), tantalum nitride (TaN), aluminum nitride (AlN), tungsten silicide ($WSi_x$), nickel silicide ($Ni_2Si$), titanium silicide ($TiSi_2$), titanium aluminide (TiAl), an alloy thereof and a combination thereof. The material of the gate dielectric layer may be any suitable material, such as silicon oxide, silicon nitride, silicon oxynitride, high-k material or other suitable insulating materials. Examples of the material of the high-k material include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, an alloy thereof and a combination thereof. Each value of x is independently from 0.5 to 3, and each value of y is independently from 0 to 2.

In some embodiments, the method 100 further includes a step of forming a source region and a drain region at both ends of the fin structure after step 130. The source region and the drain region may be formed by any suitable methods, such as doping and epitaxy.

In some embodiments, the source region and the drain region are formed by epitaxy, which includes steps of recessing the trapezoidal fin structure and epitaxially grow the source region and the drain region in the recesses. With the increased top surface of the trapezoidal fin structure, the forming process for the epitaxial source region and drain region is easier while recessing the trapezoidal fin structure, and thus the formed epitaxial source region and drain region are with enlarged volume. The material of the epitaxial source region and drain region may include Ge, Si, GaAs, AlGaAs, SiGe, GaAsP or other suitable material.

The method 100 for manufacturing the FinFET tunes the etching parameters while etching the base substrate to form the trapezoidal fin structure. The formed trapezoidal fin structure includes a larger top surface area to enhance the effective channel area of the FinFET, and the device performance of the FinFET is thereby improved. In addition, the FinFET formed by the method 100 can have better device uniformity.

Figure 2:
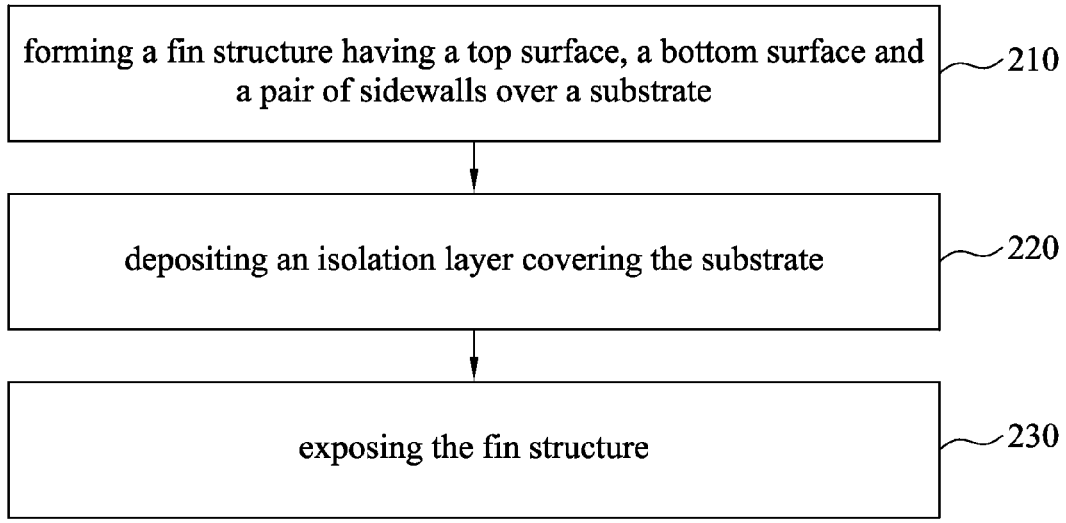
FIG. 2 is a flow chart illustrating a method for manufacturing a FinFET in accordance with some embodiments.

Referring to FIG. 2, which is a flow chart illustrating a method 200 for manufacturing a FinFET in accordance with some embodiments. It is understood that additional steps may be implemented before, during, and after the method, and some of the steps described may be replaced or eliminated for other embodiments of the method. It is noteworthy that sequences of the steps of the method 200 described herein are merely examples, and are not intended to be limiting. Various changes, substitutions, and alterations may be made without departing from the spirit and scope of the present disclosure.

In step 210, a fin structure is formed over a substrate. The formed fin structure includes a top surface, a bottom surface and a pair of sidewalls. The top surface has a width larger than the width of the bottom surface. In addition, at least one sidewall has more than one slope. That is, the at least one sidewall of the fin structure has changing slopes and is not a plane, which the plane is a two-dimensional, flat surface with no thickness. Further, the at least one sidewall and the isolation layer have an acute included angle, which is less than 90°. The fin structure is formed with a larger top surface area to enhance the effective channel area of the FinFET, and the device performance of the FinFET is thus improved.

The fin structure may be formed by any suitable processes, such as photolithography and etching. The photolithography may include forming a photoresist layer over the substrate, exposing the photoresist layer to form a pattern, performing post-exposure bake processes, and developing the pattern to form a photoresist mask. The aforementioned photoresist mask is used to protect a portion of the substrate while forming trenches in the substrate by the etching process, to form the fin structure. The substrate and the fin structure may be integrally formed, which the substrate and the fin structure are made of the same material.

Further, the fin structure may be formed by a recessing process and a depositing process. For instance, a hole with a desired shape is first formed in an isolation layer by a recessing process. Then, a fin material is deposited to fill the hole and to form a fin structure.

The fin structure formed in step 210 may be in any shape as long as the width of the top surface is larger than that of the bottom surface, at least one sidewall has more than one slopes, and the at least one sidewall and the isolation layer have an acute included angle. In some embodiments, the slopes of the pair of sidewalls of the formed fin structure are the same. That is, the sidewalls of the fin structure have the same slope profile, and the fin structure has a symmetrical cross-section along the width direction. In some embodiments, the slopes of the pair of sidewalls of the formed fin structure are different from each other. That is, the sidewalls of the fin structure have different slope profiles, and the fin structure has an unsymmetrical cross-section along the width direction. For instance, the fin structure may include a curved sidewall and an inclined sidewall.

In step 220, the isolation layer is deposited covering the substrate. Then, the fin structure is exposed in step 230. The isolation layer may be formed by any suitable depositing methods, such as chemical vapor deposition (CVD), atmospheric pressure CVD (APCVD), low pressure CVD (LPCVD), plasma enhanced CVD (PECVD), metal-organic CVD (MOCVD), physical vapor deposition (PVD), atomic layer deposition (ALD), chemical solution deposition, sputtering or a combination thereof. In some embodiments, the isolation layer is a shallow trench isolation (STI) structure. The isolation layer may be made of a dielectric material. Examples of the dielectric material include but are not limited to silicon oxide, silicon nitride, silicon oxynitride, fluoride-doped silicate glass, a low-k dielectric material and a combination thereof.

In some embodiments, the method 200 further includes a step of forming a gate stack across over the fin structure after step 230. The gate stack may include a gate dielectric layer and a gate electrode, and may be formed by any suitable methods, such as deposition. In some embodiments, the gate dielectric layer and the gate electrode are formed by chemical vapor deposition (CVD), atmospheric pressure CVD (APCVD), low pressure CVD (LPCVD), plasma enhanced CVD (PECVD), metal-organic CVD (MOCVD), physical vapor deposition (PVD), atomic layer deposition (ALD), chemical solution deposition, sputtering or a combination thereof. The materials of the gate electrode and the gate dielectric layer may be any suitable materials, and examples of the materials of the gate electrode and the gate dielectric layer may refer to the related descriptions described above.

In some embodiments, the method 200 further includes a step of forming a source region and a drain region at both ends of the fin structure after step 230. The source region and the drain region may be formed by any suitable methods, such as doping and epitaxy.

In some embodiments, the source region and the drain region are formed by epitaxy, which includes steps of recessing the fin structure and epitaxially grow the source region and the drain region in the recesses. With the increased top surface of the fin structure, the forming process for the epitaxial source region and drain region is easier while recessing the fin structure, and thus the formed epitaxial source region and drain region are with enlarged volume. The material of the epitaxial source region and drain region may include Ge, Si, GaAs, AlGaAs, SiGe, GaAsP or other suitable material.

The method 200 for manufacturing the FinFET forms the fin structure with a larger top surface area to enhance the effective channel area of the FinFET. The enhanced effective channel area improves the device performance of the FinFET.

Figure 3:
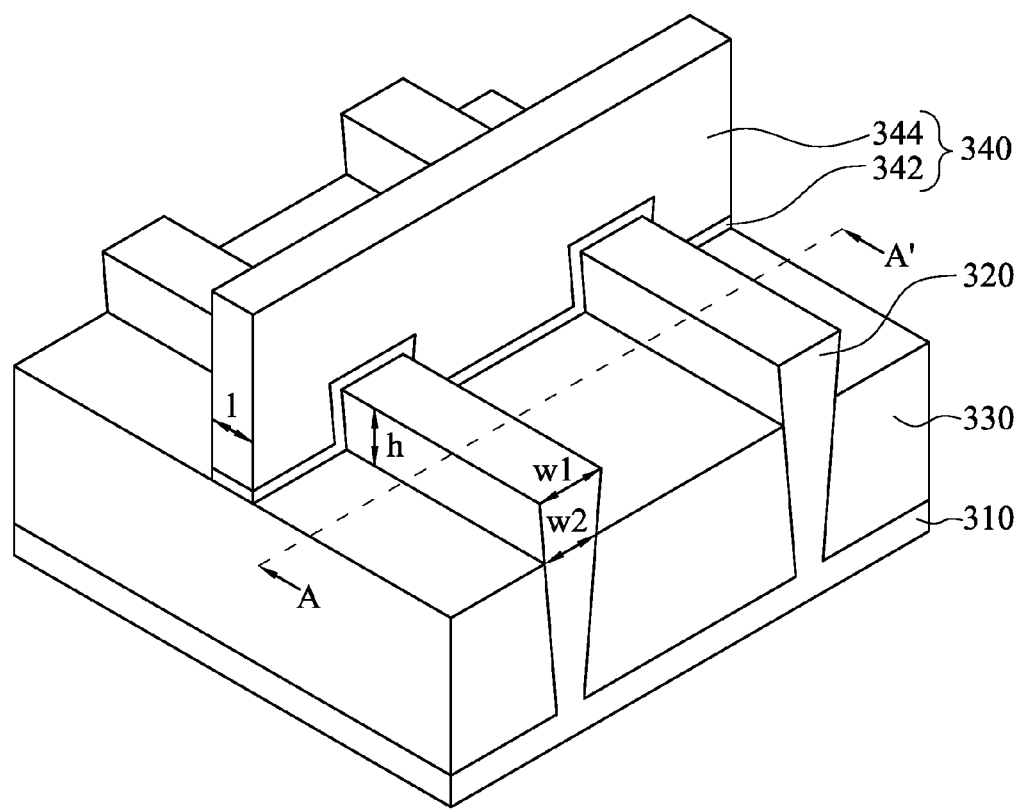
FIG. 3 is a schematic perspective view of a FinFET in accordance with some embodiments.

Referring to FIG. 3, which is a schematic perspective view of a FinFET 300 in accordance with some embodiments. The FinFET 300 includes a substrate 310, trapezoidal fin structures 320, an isolation layer 330 and a gate stack 340. The trapezoidal fin structures 320 are over the substrate 310. The gate stack 340 is across over the trapezoidal fin structures 320, and includes a gate dielectric layer 342 and a gate electrode 344. The FinFET 300 may be formed by the method 100 for manufacturing a FinFET described above.

In some embodiments, the substrate 310 is a bulk substrate or a semiconductor-on-insulator (SOI) substrate. Examples of the material of the substrate 310 includes but are not limited to silicon, silicon germanium, silicon carbide, gallium arsenic, gallium phosphide, indium phosphide, indium arsenide, indium antimonide and a combination thereof.

Each of the trapezoidal fin structures 320 has a trapezoidal cross-section along the width direction. A portion of each fin structure 320 is covered by the isolation layer 330, which is used to separate the two trapezoidal fin structures 320. The exposed portion of each fin structure 320 includes a top surface and a bottom surface. The top surface has a width w1, and the bottom surface has a width w2. The width w1 is larger than the width w2. In some embodiments, the widths w1 and w2 of the top surface and the bottom surface of the trapezoidal fin structures 320 are independently in a range from about 1 nm to about 25 nm. The exposed portion of each fin structure 320 has a height h, which is the length of sidewall of the trapezoidal fin structures 320 from the top surface of the trapezoidal fin structures 320 to the top surface of the isolation layer 330. In some embodiments, the height h of the trapezoidal fin structures 320 is in a range from about 10 nm to about 80 nm. In some embodiments, the substrate 310 and the trapezoidal fin structures 320 are integrally formed, which there is no boundary between the substrate 310 and the fin structure 320. In some embodiments, the substrate 310 and the trapezoidal fin structures 320 are made of the same material.

In some embodiments, the isolation layer 330 is a shallow trench isolation (STI) structure. The isolation layer 330 is between the trapezoidal fin structures 320, and is configured to separate the two trapezoidal fin structures 320. The isolation layer 330 may be made of a dielectric material.

Examples of the dielectric material include but are not limited to silicon oxide, silicon nitride, silicon oxynitride, fluoride-doped silicate glass, a low-k dielectric material and a combination thereof.

The gate dielectric layer 342 is across over the trapezoidal fin structures 320, and the gate electrode 344 is over the gate dielectric layer 342. The gate dielectric layer 342 is interposed between the trapezoidal fin structures 320 and the gate electrode 344. In some embodiments, the gate stack has a thickness 1 in a range from about 5 nm to about 50 nm.

The FinFET 300 may further include a source region (not shown) and a drain (not shown) region at both ends of the trapezoidal fin structures 320. The portion of the trapezoidal fin structures 320 between the source region and the drain region serves as the channel of the FinFET 300. The effective channel area of the FinFET 300 may be calculated by the following formula I:

$$\text{Effective channel area} = (2h + w1) \times l \qquad \text{I}$$

The FinFET 300 includes the trapezoidal fin structures 320 with larger top surfaces. Comparing to a conventional FinFET, which the width of the top surface of the fin structure is smaller than that of the bottom surface of the fin structure, the FinFET 300 includes increased width w1 of the top surface of each fin structure 320 to enlarge the effective channel area of the FinFET 300. Therefore, the device performance of the FinFET 300 is improved.

FIGS. 4A through 4F are cross-sectional views at various stages of manufacturing a FinFET 400, which may be cross-sectional views taken along line A-A' in FIG. 3, i.e. the width direction of the trapezoidal fin structures 320.

Figure 4A:
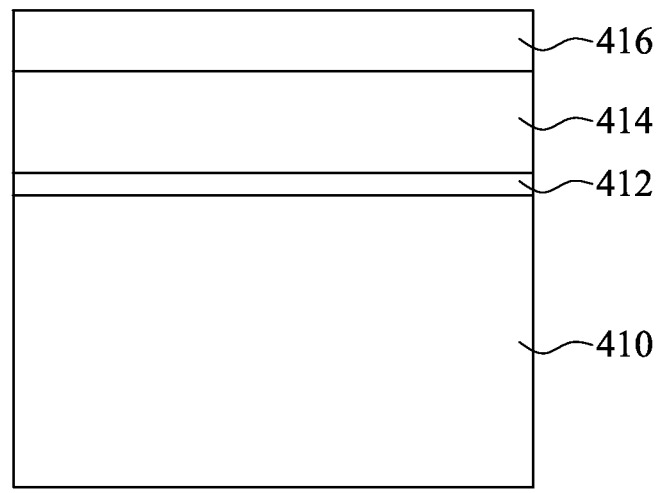
FIGS. 4A through 4F are schematic cross-sectional views at various stages of manufacturing the FinFET along line A-A in FIG. 3.

Referring to FIG. 4A, a first oxide layer 412, a nitride layer 414 and a second oxide layer 416 are deposited over a base substrate 410. The substrate 410 may be made of any suitable material, such as silicon, silicon germanium, silicon carbide, gallium arsenic, gallium phosphide, indium phosphide, indium arsenide, indium antimonide and a combination thereof. The first oxide layer 412 serves as a buffer layer, which releases the stress during the deposition of the nitride layer 414. The nitride layer 414 serves as a shield, which protects fin structures against etching in the subsequent manufacturing process. In some embodiments, the nitride layer 414 is made of silicon nitride. The second oxide layer prevents the fin structures from being etched in the subsequent manufacturing process as well.

Figure 4B:
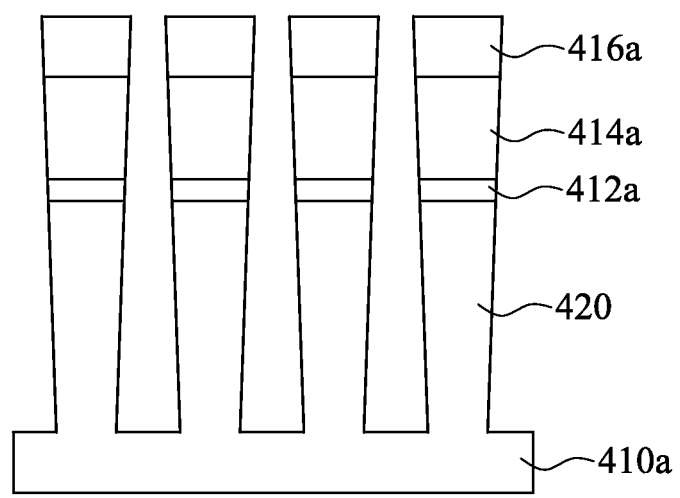

Referring to FIG. 4B, the base substrate 410, the first oxide layer 412, the nitride layer 414 and the second oxide layer 416 are etched to form an etched base substrate 410a, an etched first oxide layer 412a, an etched nitride layer 414a and an etched second oxide layer 416a. Trapezoidal fin structures 420 are then formed over the etched base substrate 410a.

In some embodiments, the etching is performed by plasma etching. The plasma etching may be performed by $CH_4$, $CH_xF_y$, $Cl_2$, HBr plasma, or the like. The etching parameters are tuned to form the fin structures 420 with a larger top surface area to enhance effective channel area of the FinFET 400. In some embodiments, the etching is performed at an etching bias in a range from about 100 mV to about 200 mV, which is higher than conventional method to increase the amount of ions that bump against the bottom of the fin structure. In some embodiments, the etching is performed at a power in a range from about 400 W to about 800 W, which is larger than conventional method to form the fin structure 420 having a larger top surface. In some embodiments, the etching is performed at a flow rate of the plasma in a range from about 50 sccm to about 250 sccm, which is faster than conventional method to reduce the plasma gas deposition at the bottom of the fin structure.

Figure 4C:
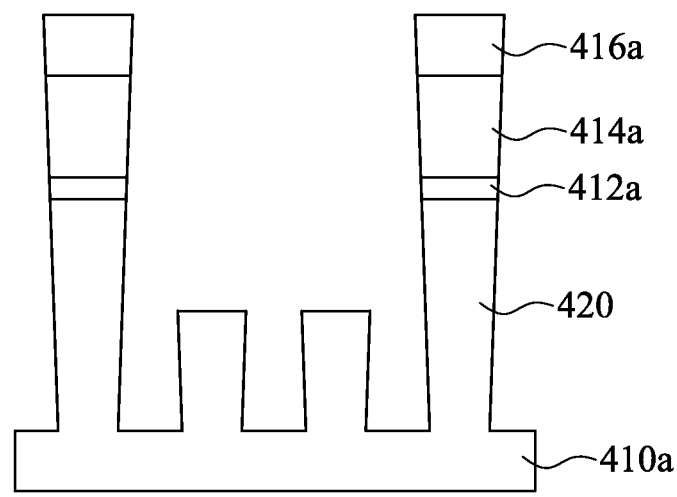

Referring to FIG. 4C, some trapezoidal fin structures 420 are removed to avoid that the trapezoidal fin structures 420 are too close to each other, which prevent a short circuit between adjacent trapezoidal fin structures 420.

Figure 4D:
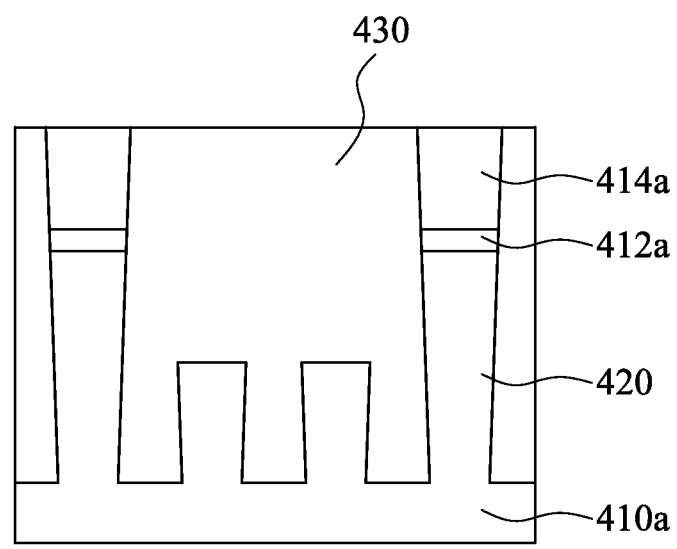

Referring to FIG. 4D, the etched second oxide layer 416a is removed. Then, the material of an isolation layer 430 was deposited to cover the etched base substrate 410a. The material of the isolation layer 430 may be deposited by any suitable methods, such as chemical vapor deposition (CVD), atmospheric pressure CVD (APCVD), low pressure CVD (LPCVD), plasma enhanced CVD (PECVD), metal-organic CVD (MOCVD), physical vapor deposition (PVD), atomic layer deposition (ALD), chemical solution deposition, sputtering or a combination thereof. In some embodiments, the isolation layer was polished by chemical-mechanical polishing (CMP) after the deposition to expose the top surface of the etched nitride layer 414a. In some embodiments, the isolation layer is a shallow trench isolation (STI) structure. The isolation layer may be made of a dielectric material, such as silicon oxide, silicon nitride, silicon oxynitride, fluoride-doped silicate glass, a low-k dielectric material and a combination thereof.

Figure 4E:
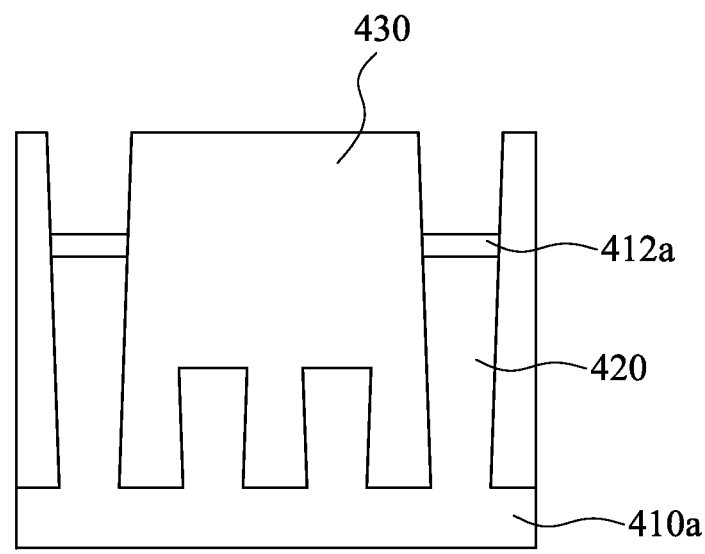

Referring FIG. 4E, the etched nitride layer 414a is removed.

Figure 4F:
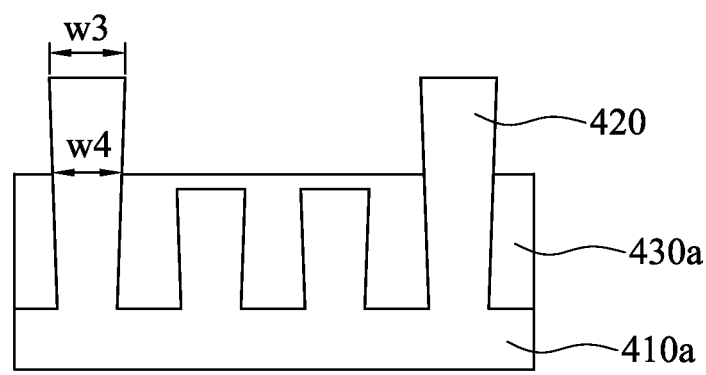

Referring to FIG. 4F, the isolation layer 430 is recessed to expose the trapezoidal fin structures 420, and the etched first oxide layer 416a is removed, and the FinFET 400 is then formed. The exposed trapezoidal fin structures 420 are inverted trapezoidal fin structures, which the cross-sectional view of the trapezoidal fin structures 420 has a shape of inverted trapezoid.

After the formation of the FinFET 400, conventional manufacturing processes can be performed. In some embodiments, a gate stack is formed across over the fin structures 420 to form the structure shown in FIG. 3. Then, a source region and a drain region may be formed at both ends the fin structures 420.

The gate stack may be formed by any suitable processes, and may include depositions to form various gate materials, a CMP process to remove the excessive gate materials, and planarize the top surface of the FinFET. In some embodiments, the gate stack includes a gate dielectric layer across over the fin structures and a gate electrode over the gate dielectric layer. The gate dielectric layer and the gate electrode may be formed by deposition, and may be made of any suitable materials. The specific features of the deposition methods and materials for the gate dielectric layer and the gate electrode may refer to the related descriptions described above.

The source region and the drain region may be formed by any suitable processes, such as doping and epitaxy. In some embodiments, the source region and the drain region are epitaxial source region and drain region. With the increased top surface of the fin structures 420, the formed epitaxial source region and drain region can have enlarged volume. Therefore, the FinFET 400 has better epitaxial stress concentrated since the epitaxial volume is enlarged. In some embodiments, the material of the epitaxial source region and drain region is Ge, Si, GaAs, AlGaAs, SiGe, GaAsP or other suitable material.

The fin structures 420 of the FinFET 400 is formed by etching with tuned etching parameters to form the fin structures 420 having the top surface larger than the bottom surface, which enlarges the effective channel area of the FinFET 400. With the enlarged effective channel area, a greater portion of the gate material can interface with the fin structures. Therefore, the FinFET 400 can achieve improved FinFET device performance.

Figure 5:
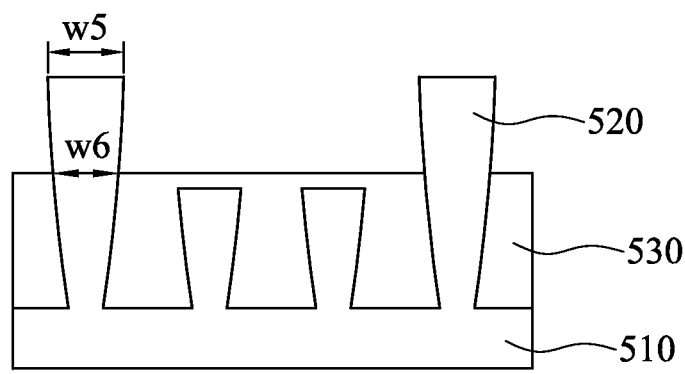
FIG. 5 is a schematic cross-sectional view of a FinFET in accordance with some embodiments.

Referring to FIG. 5, which is a schematic cross-sectional view of a FinFET 500 in accordance with some embodiments. The FinFET 500 includes a substrate 510, fin structures 520 and an isolation layer 530. The fin structures 520 are over the substrate 510. The isolation layer 530 is over the substrate 510, and the fin structures 520 are protruding from the isolation layer 530. Each of the trapezoidal fin structures 520 has a top surface, a bottom surface, and a pair of sidewalls. The width w5 of the top surface of each fin structure 520 is larger than the width w6 of the bottom surface. The slopes of the pair of sidewalls of the fin structures 520 are the same, which means that the fin structures 520 have a symmetrical cross-section along the width direction, and the sidewalls are curved and converged toward the center of the fin structure 520. Included angles between the sidewalls of the fin structures 520 and the isolation layer 530 are acute. The FinFET 500 may be formed by the method 200 for manufacturing a FinFET described above.

In some embodiments, the widths w5 and w6 of the top surface and the bottom surface of the fin structures 520 are independently in a range from about 1 nm to about 25 nm. The fin structures 520 may have a height in a range from about 10 nm to about 80 nm.

In some embodiments, the FinFET 500 includes a gate stack (not shown) across over the fin structures 520. The gate stack may have a thickness in a range from about 5 nm to about 50 nm. The effective channel area of the FinFET 500 may be calculated by the foregoing formula I with w1 replaced by w5.

The FinFET 500 includes the fin structures 520 with larger top surfaces. Comparing to a conventional FinFET, which the width of the top surface of the fin structures is smaller than that of the bottom surface of the fin structure, the increased width w5 of the top surface of each fin structure 520 enlarges the effective channel area of the FinFET 500. Therefore, the device performance of the FinFET 500 is improved.

The FinFET 500 includes the fin structures 520 with a larger top surface area to enhance the effective channel area of the FinFET 500, and the device performance of the FinFET 500 is thus improved.

Figure 6:
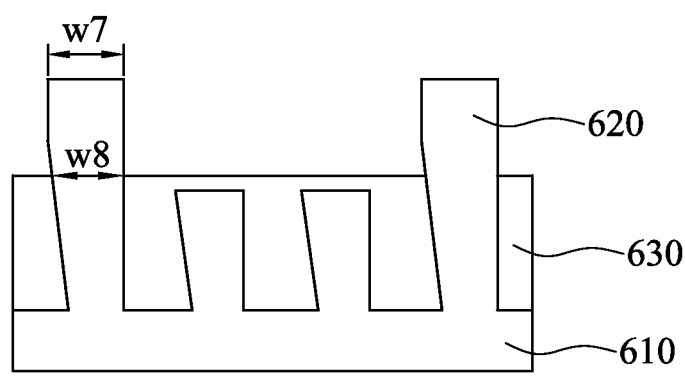
FIG. 6 is a schematic cross-sectional view of a FinFET in accordance with some embodiments.

Referring to FIG. 6, which is a schematic cross-sectional view of a FinFET 600 in accordance with some embodiments. The FinFET 600 includes a substrate 610, fin structures 620 and an isolation layer 630. The fin structures 620 are over the substrate 610. The isolation layer 630 is over the substrate 610, and the fin structures 620 are protruding from the isolation layer 630. Each of the trapezoidal fin structures 620 has a top surface and a bottom surface, and the width w7 of the top surface is larger than the width w8 of the bottom surface. Each of the fin structures 620 includes a pair of sidewalls. The slopes of the pair of sidewalls of the fin structures 620 are different, which means that the fin structures 620 have an unsymmetrical cross-section along the width direction. Particularly, one sidewall of each fin structure 620 is vertical, while another sidewall of each fin structure 620 has two slopes and can be divided into an upper portion and a lower portion. The slope of the upper portion of the sidewall of each fin structure 620 is infinite, i.e. the slope of the upper portion of the sidewall is vertical. The absolute value of the slope of the lower portion of the sidewall of each fin structure 620 is greater than zero and less than infinite. That is, the slope of the lower portion of the sidewall of each fin structure 620 is inwardly inclined, which is inclined toward the center of the fin structure 620, and the lower portion of the sidewall is converged. Included angles between the inclined sidewalls of the fin structures 620 and the isolation layer 630 are acute. The FinFET 600 may be formed by the method 200 for manufacturing a FinFET described above.

The difference between the FinFET 600 and the FinFET 500 is the shape of the fin structures. The sidewalls of the fin structures 520 are curved, while one of the sidewalls of the fin structures 620 includes more than one slope. The difference does not affect the functions of each component of the FinFET 600. Therefore, the FinFET 600 has the same characteristics and advantages as the FinFET 500.

The embodiments of the present disclosure discussed above have advantages over exiting methods and systems. The FinFET includes the fin structure having a larger top surface area than that of the bottom surface, which enlarges the effective channel area of the FinFET. With the enlarged effective channel area, the FinFET has improved FinFET device performance. Further, if the FinFET includes epitaxial source region and drain region, the FinFET has better epitaxial stress concentrated since epitaxial volume is enlarged. It is understood, however, that other embodiments may have different advantages, and that no particular advantages is required for all embodiments.

In accordance with some embodiments of the present disclosure, a method for manufacturing a FinFET includes etching a base substrate to form a trapezoidal fin structure. Next, an isolation layer is deposited covering the etched base substrate. Then, the trapezoidal fin structure is exposed. The trapezoidal fin structure includes a top surface and a bottom surface, and the top surface has a width larger than that of the bottom surface.

In accordance with other embodiments of the present disclosure, a method for manufacturing a FinFET includes forming a fin structure having a top surface, a bottom surface and a pair of sidewalls over a substrate. Next, an isolation layer is deposited covering the substrate. Then, the fin structure is exposed. The top surface of the fin structure has a width larger than that of the bottom surface. At least one sidewall has more than one slope. At least one sidewall and the isolation layer have an acute included angle.

In accordance with yet other embodiments of the present disclosure, a FinFET includes a substrate, a fin structure and an isolation layer. The fin structure is over the substrate and has a top surface, a bottom surface and a pair of sidewalls. The isolation layer is over the substrate, and the fin structure is protruding from the isolation layer. The top surface of the fin structure has a width larger than that of the bottom surface. At least one sidewall has more than one slope. An included angle between at least one sidewall and the isolation layer is acute.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a FinFET, comprising:
   etching a base substrate to form at least two trapezoidal fin structures adjacent to each other;
   removing an upper portion of a first trapezoidal fin structure of the at least two trapezoidal fin structures to form a trapezoidal dummy fin structure;
   depositing an isolation layer covering a second trapezoidal fin structure of the at least two trapezoidal fin structures and the trapezoidal dummy fin structure; and
   exposing an upper portion of the second trapezoidal fin structure,
   wherein the second trapezoidal fin structure comprises a top surface, a bottom surface, and a pair of sidewalls over the base substrate, wherein the top surface has a width larger than that of the bottom surface, and a pair of slopes of the sidewalls are different from each other.

2. The method of claim 1, wherein etching the base substrate is performed by plasma etching.

3. The method of claim 2, wherein the plasma etching is performed by $CH_4$, $CH_xF_y$, $Cl_2$, or HBr plasma.

4. The method of claim 2, wherein etching the base substrate is performed at an etching bias in a range from about 100 mV to about 200 mV.

5. The method of claim 2, wherein etching the base substrate is performed at a power in a range from about 400 W to about 800 W.

6. The method of claim 2, wherein etching the base substrate is performed at a flow rate in a range from about 50 sccm to about 250 sccm.

7. The method of claim 1, further comprising forming a gate stack across over the second trapezoidal fin structure.

8. A method for manufacturing a FinFET, comprising:
   forming at least two fin structures adjacent to each other;
   removing an upper portion of a first fin structure of the at least two fin structures to form a dummy fin structure;
   depositing an isolation layer covering a second fin structure of the at least two fin structures and the dummy fin structure; and
   exposing an upper portion of the second fin structure,
   wherein the second fin structure has a top surface, a bottom surface, and a pair of sidewalls over a substrate, and the top surface of the second fin structure has a width larger than that of the bottom surface, at least one sidewall of the pair of sidewalls has more than one slope, the slopes of the pair of sidewalls are different from each other, and each of the pair of sidewalls and the isolation layer have an acute included angle.

9. The method of claim 8, wherein the widths of the top surface and the bottom surface of the second fin structure are independently in a range from about 1 nm to about 25 nm.

10. The method of claim 8, further comprising forming a gate stack across over the second fin structure.

11. A FinFET, comprising:
    a substrate;
    a fin structure over the substrate and having a top surface, a bottom surface, and a pair of sidewalls;
    a dummy fin structure over the substrate and having a top surface, a bottom surface, and a pair of sidewalls; and
    an isolation layer over the substrate, wherein an upper portion of the fin structure is protruding from the isolation layer, and the dummy fin structure is covered by the isolation layer and adjacent to the fin structure,
    wherein the top surface of the fin structure has a width larger than that of the bottom surface, at least one sidewall of the pair of sidewalls of the fin structure has more than one slope, the slopes of the pair of sidewalls are different from each other, and an included angle between the at least one sidewall and the isolation layer is acute.

12. The FinFET of claim 11, wherein the widths of the top surface and the bottom surface of the fin structure are independently in a range from about 1 nm to about 25 nm.

13. The FinFET of claim 11, wherein the fin structure has a height in a range from about 10 nm to about 80 nm.

14. The FinFET of claim 11, further comprising a gate stack across over the fin structure.

15. The method of claim 1, wherein depositing the isolation layer covering the second trapezoidal fin structure of the at least two trapezoidal fin structures and the trapezoidal dummy fin structure is performed by chemical vapor deposition.

16. The method of claim 1, wherein the isolation layer is a shallow trench isolation (STI) structure.

17. The method of claim 8, wherein depositing the isolation layer covering the second fin structure of the at least two fin structures and the dummy fin structure is performed by chemical vapor deposition.

18. The method of claim 8, wherein the isolation layer is a shallow trench isolation (STI) structure.

19. The FinFET of claim 11, wherein the isolation layer is silicon oxide, silicon nitride, silicon oxynitride, fluoride-doped silicate glass, a low-k dielectric material, or a combination thereof.

20. The FinFET of claim 11, wherein the isolation layer is a shallow trench isolation (STI) structure.

* * * * *